(12) United States Patent
Nagata (10) Patent No.: US 8,134,877 B2
(45) Date of Patent: Mar. 13, 2012

(54) SEMICONDUCTOR DEVICE HAVING DELAY CONTROL CIRCUIT

(75) Inventor: Kyoichi Nagata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 129 days.

(21) Appl. No.: 12/588,200

(22) Filed: Oct. 7, 2009

(65) Prior Publication Data

US 2010/0085824 A1   Apr. 8, 2010

(30) Foreign Application Priority Data

Oct. 8, 2008 (JP) ................................. 2008-261805

(51) Int. Cl.
*G11C 7/00* (2006.01)
(52) U.S. Cl. ..................... 365/194; 365/207; 365/191
(58) Field of Classification Search .................. 365/194, 365/207, 191
See application file for complete search history.

(56) References Cited

U.S. PATENT DOCUMENTS

| 7,161,855 B2 | 1/2007 | Kodama | |
| 7,478,287 B2 * | 1/2009 | Funaba et al. | 714/700 |
| 7,548,471 B2 * | 6/2009 | Loeffler et al. | 365/194 |
| 7,746,714 B2 * | 6/2010 | Lee | 365/207 |

FOREIGN PATENT DOCUMENTS

JP         2005-267744         9/2005

* cited by examiner

*Primary Examiner* — Hoai V Ho
*Assistant Examiner* — Kretelia Graham
(74) *Attorney, Agent, or Firm* — McGinn IP Law Group, PLLC (57) ABSTRACT

A first delay circuit and a second delay circuit having different operation conditions from each other, a detection circuit that detects a difference in propagation speed of a pulse signal, which is simultaneously input to the first and second delay circuits, and a setting circuit that generates a selection signal based on a detection result from the detection circuit are provided. The selection signal is supplied to a delay control circuit that generates an operation timing signal by delaying a reference signal, of which a delay amount is controlled by the selection signal. With this arrangement, a necessity to set the delay amount of the delay control circuit with a large design margin can be eliminated considering PVT variation, and as a result, performance degradation can be prevented.

11 Claims, 9 Drawing Sheets

| | THRESHOLD VALUE | POWER SOURCE VOLTAGE | AMBIENT TEMPERA-TURE |
|---|---|---|---|
| SMALL ↑ | LOW | HIGH | LOW |
| DELAY AMOUNT | DESIGN VALUE | DESIGN VALUE | DESIGN VALUE |
| LARGE ↓ | HIGH | LOW | HIGH |

|         | FAST LEVEL | CENTER LEVEL | SLOW LEVEL | DELAY PASSED THROUGH |
|---------|------------|--------------|------------|----------------------|
| $OUT_{i-1}$ | H | L | L | THREE |
| $OUT_i$ | L | H | L | TWO |
| $OUT_{i+1}$ | L | L | H | ONE |
| SEL1 | H | L | L | - |
| SEL2 | L | L | H | - |

SEMICONDUCTOR DEVICE HAVING DELAY CONTROL CIRCUIT

BACKGROUND OF THE INVENTION

1. Field of the Invention

The present invention relates to a semiconductor device, and, more particularly relates to a semiconductor device including a delay control circuit that generates an operation timing signal by delaying a reference signal.

2. Description of Related Art

An internal circuit of a semiconductor device generally uses a clock signal to determine its operation timing. Therefore, it suffices to increase a frequency of the clock signal to operate the semiconductor device at high speed.

However, in a semiconductor memory device such as a DRAM (Dynamic Random Access Memory), increasing a frequency of a clock signal cannot always lead to a high speed operation of its memory cell array because the memory cell array performs an analog operation. Consequently, an interval from a timing for starting a predetermined operation (for example, an activation timing of a word driver) for the memory cell array to another timing for starting a subsequent operation (for example, an activation timing of a sense amplifier) is virtually constant regardless of the frequency of the clock signal. In such an analog operation unit, a delay control circuit is employed for generating a timing signal.

The delay control circuit is a circuit including a plurality of delay elements connected in series. A pulse signal used as a reference signal is input to the delay control circuit, and an operation timing signal is output therefrom. In the example described above, a pulse signal synchronized with the activation timing of the word driver is input to the delay control circuit, and an activation timing signal for a sense amplifier is output from the delay control circuit.

However, a delay amount of each of the delay elements is not always constant, and varies according to various conditions. Major factors that cause a variation of the delay amount include: first, a deviation of threshold voltage caused by a process fluctuation (P variation); second, a variation in power source voltage (V variation); and third, a variation in ambient temperature (T variation). The variation caused by these factors is called "PVT variation". The larger the PVT variation is, the more the operation timing is deviated from its design value, which causes a malfunction of a device in some cases.

When a delay amount of a delay control circuit is decreased by a large amount from its design value due to the PVT variation, an operation timing signal, which is an output of the delay control circuit, becomes activated earlier than a timing at which the operation timing signal is supposed to be activated. If the operation timing signal is an activation signal of a sense amplifier, for example, a sense amplifier becomes activated before a sufficient potential difference is generated between bit lines, resulting in an erroneous read operation. To prevent such a malfunction, it is necessary to set the delay amount of the delay control circuit with a sufficiently large design margin, such that the operation timing signal is not activated too early even when the delay amount of the delay control circuit is minimized due to the PVT variation. However, in this case, the performance can be degraded because the activation of the operation timing signal becomes unnecessarily slow under a normal operation condition.

Meanwhile, Japanese Patent Application Laid-open No. 2005-267744 (hereinafter, "Patent Document 1") proposes a method to cope with the problem, in which an activation timing of a sense amplifier is generated by using a dummy word line, a dummy bit line, and a dummy cell, instead of using a plurality of delay elements.

However, in Patent Document 1, because additional circuits such as the dummy word line, the dummy bit line, and the dummy cell are required to generate a timing signal, there is a problem that the circuit size is considerably increased. In addition, with the method proposed in Patent Document 1, there is another problem that the power consumption is considerably increased because it is required to operate a dummy circuit every time an access is requested.

SUMMARY

The present invention seeks to solve one or more of the above problems, or to improve upon those problems at least in part.

In one embodiment, there is provided a semiconductor device that includes: a delay control circuit that generates an operation timing signal by delaying a reference signal by a predetermined delay amount; a first delay circuit having a plurality of first delay elements connected in series; a second delay circuit having a plurality of second delay elements connected in series, the first and second delay elements operating different conditions, respectively; a detection circuit that detects a difference in propagation speed of a pulse signal simultaneously input to the first and second delay circuits; and a setting circuit that sets the delay amount of the delay control circuit based on a detection result from the detection circuit.

As described above, according the present invention, the variation of the delay amount due to PVT variation can be properly corrected because the delay amount of the delay control circuit is set based on a difference in propagation speed between two delay circuits having different operation conditions. Consequently, it is possible to prevent performance degradation, because it is not necessary to set the delay amount of the delay control circuit with a large design margin considering the PVT variation. Furthermore, because additional circuits, such as a dummy word line, a dummy bit line, and a dummy cell, are not required, there is no considerable increase in the circuit size and power consumption.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
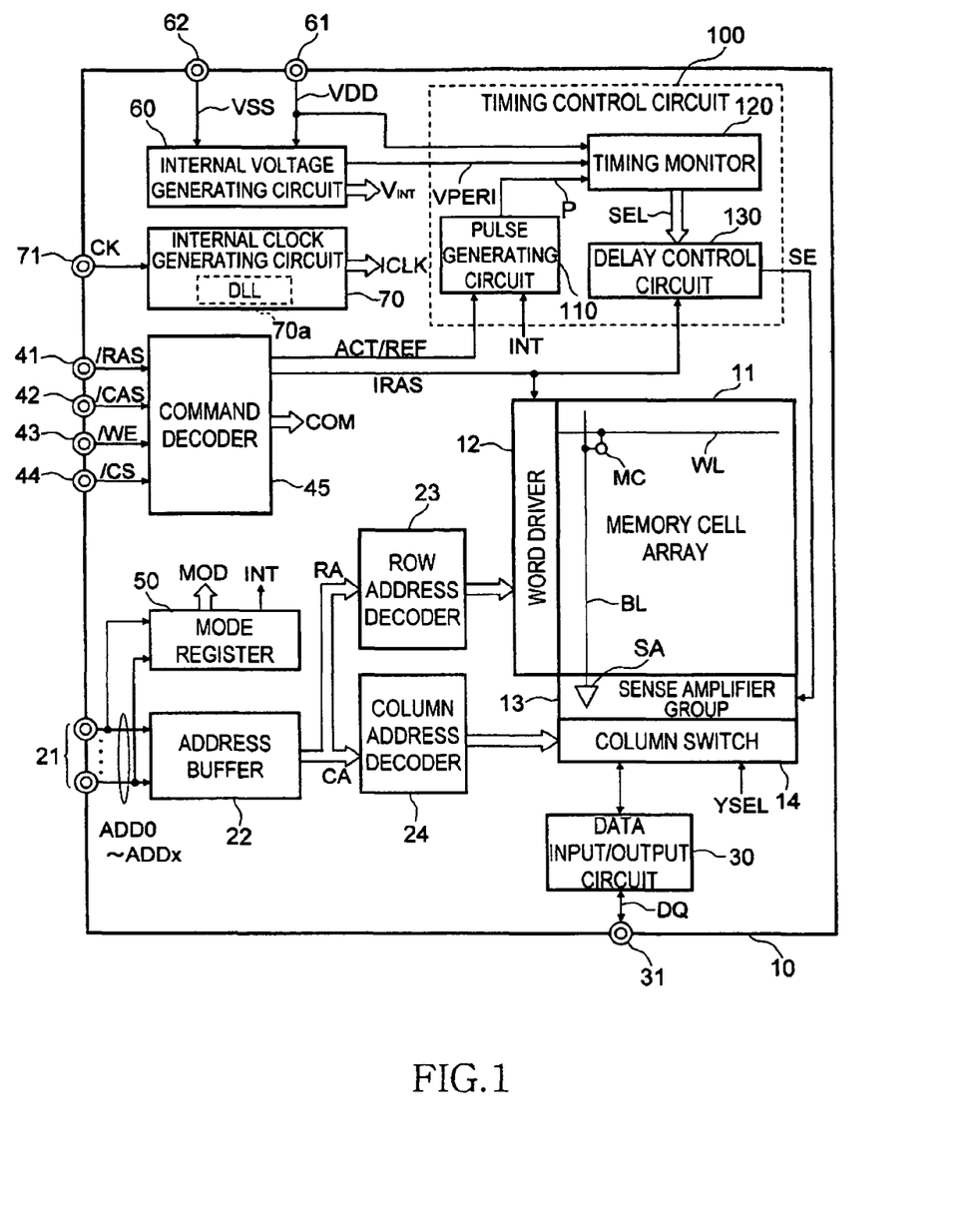
FIG. 1 is a block diagram showing a configuration of a semiconductor device 10 according to an embodiment of the present invention.

FIG. 1 is a block diagram showing a configuration of a semiconductor device 10 according to an embodiment of the present invention.

The semiconductor device 10 according to the first embodiment includes a memory cell array 11 that includes a plurality of word lines WL, a plurality of bit lines BL, and a plurality of memory cells MC each arranged at a point at the intersection of the word line WL with the bit line BL. For simplicity, one word line WL, one bit line BL, and one memory cell MC are shown in FIG. 1. The memory cell MC used in the present embodiment is a DRAM, although it is not particularly limited thereto.

The word lines WL are connected to a word driver 12, and any one of the word lines WL is selected by the word driver 12. The selection of the word line WL by the word driver 12 is performed based on a row address RA supplied to a row address decoder 23 out of address signals ADD0 to ADDx that are supplied to an address buffer 22. The address buffer 22 receives the address signals ADD0 to ADDx via an address terminal group 21.

The bit lines BL are connected to a sense amplifier group 13. The sense amplifier group 13 is a circuit that is constituted by a plurality of sense amplifiers SA. Each of the sense amplifiers SA is connected to its corresponding one of the bit lines BL. For simplicity, only one sense amplifier SA is shown in FIG. 1. The sense amplifiers SA are activated by a sense enable signal SE, and any one of the sense amplifiers SA is selected by a column switch 14. The selection of a sense amplifier by the column switch 14 is performed based on a column address CA supplied to a column address decoder 24 out of the address signals ADD0 to ADDx that are supplied to the address buffer 22.

The sense amplifier SA selected by the column switch 14 is connected to a data input/output circuit 30. The data input/output circuit 30 is connected to a data input/output terminal 31. In a read operation, read data DQ that is amplified by the selected sense amplifier SA is output to the data input/output terminal 31 via the data input/output circuit 30. On the other hand, in a write operation, write data DQ that is input from the data input/output terminal 31 is supplied to the selected sense amplifier SA via the data input/output circuit 30, and finally, write data is written in a predetermined memory cell.

The read operation and the write operation are specified by various commands supplied via command terminals 41 to 44. The command terminals 41 to 44 are terminals to which a /RAS (row address strobe) signal, a /CAS (column address strobe) signal, a /WE (write enable) signal, and a /CS (chip select) signal are supplied, respectively. The signals supplied via the command terminals 41 to 44 are supplied to a command decoder 45. A slash (/) assigned to the top of reference letter of each signal name means that the signal is low active.

The command decoder 45 is a circuit that generates various internal commands COM or the like based on a combination of the input commands. For example, if the levels of the /RAS signal and the /CS signal are Low and the levels of the /CAS signal and the /WE signal are High, the command decoder 45 interprets this combination as an active command, and generates an active signal ACT. The active signal ACT is an internal signal for executing an access based on a row address. Therefore, at this timing, the address signals ADD0 to ADDx that are stored in the address buffer 22 are recognized as the row address RA and supplied to the row address decoder 23. After activating the active signal ACT, the command decoder 45 generates a strobe signal IRAS at a predetermined timing. The strobe signal IRAS is a signal for determining an activation timing of the word driver 12. In the present embodiment, the strobe signal IRAS is supplied to a timing control circuit 100 as well as the word driver 12. The timing control circuit 100 includes a delay control circuit 130 that generates a sense enable signal SE at a predetermined timing after the strobe signal IRAS is activated. Details of the timing control circuit 100 will be described later.

As another example of the decode operation by the command decoder 45, if the levels of the /RAS signal, the /CAS signal, and the /CS signal are Low, the command decoder 45 interprets this combination as a read command or a write command, and generates an internal read signal (not shown) or an internal write signal (not shown). The internal read signal and the internal write signal are internal signals for executing an access based on a column address. Therefore, at this timing, the address signals ADD0 to ADDx that are stored in the address buffer 22 are recognized as the column address CA and supplied to the column address decoder 24. Furthermore, as still another example of the decode operation by the command decoder 45, if the levels of the /CAS signal, and the /CS signal are Low and the levels of the /RAS signal and the /WE signal are High, the command decoder 45 interprets this combination as a refresh command, and generates a refresh signal REF. The refresh signal REF is an internal signal for executing a refresh operation of the memory cells MC.

As shown in FIG. 1, the active signal ACT and the refresh signal REF are also supplied to the timing control circuit 100.

Moreover, if a command that is input to the command decoder 45 is an MRS (mode register set) command, the address signals ADD0 to ADDx that are supplied to the address terminal group 21 at this timing are supplied to a mode register 50. The mode register 50 is a register for setting various operation modes of the semiconductor device 10 (such as latency). A mode signal MOD and the like that indicate setting contents of the mode register 50 are supplied to a predetermined circuit block in the semiconductor device 10. When initialization information is set on the mode register 50, the mode register 50 activates an initialization signal INT. The initialization signal INT is supplied to the timing control circuit 100.

The various circuit blocks described above operate based on an external voltage VDD or an internal voltage $V_{INT}$ as an operating power supply and an internal clock signal ICLK as a timing signal.

The internal voltage $V_{INT}$ is generated from the external voltage VDD and an external voltage VSS by an internal voltage generating circuit 60. The external voltage VDD and the external voltage VSS are supplied from the outside via power supply terminals 61 and 62, respectively. The internal voltage $V_{INT}$ is not a single voltage, but is a general term for a plurality of internal voltages. The internal voltage generating circuit 60 further generates an internal voltage $V_{PERI}$ as well as the internal voltage $V_{INT}$. The internal voltage $V_{PERI}$ works as an operating power supply for various peripheral circuits. The internal voltage $V_{PERI}$ is lower than the external voltage VDD (VDD>$V_{PERI}$). The internal voltage $V_{PERI}$ is also supplied to the timing control circuit 100.

The internal clock signal ICLK is a general term for a plurality of signals generated by an internal clock generating circuit 70. The internal clock generating circuit 70 receives an external clock signal CK that is supplied from the outside via a clock terminal 71, and generates the internal clock signal ICLK based on the received external clock signal CK. The internal clock generating circuit 70 includes a DLL circuit 70a. The DLL circuit 70a generates an internal clock signal to be supplied to the data input/output circuit 30. The data input/output circuit 30 performs input and output of the read data DQ or the write data DQ in synchronization with the internal clock signal generated by the DLL circuit 70a.

The timing control circuit 100 includes a pulse generating circuit 110, a timing monitor 120, and the delay control circuit 130. The delay control circuit 130 generates the sense enable signal SE at a predetermined timing by delaying the strobe signal IRAS. The delay amount for delaying the strobe signal IRAS is variable and is set by the timing monitor 120. A circuit configuration and an operation of the timing control circuit 100 are explained below in detail.

Figure 2A:
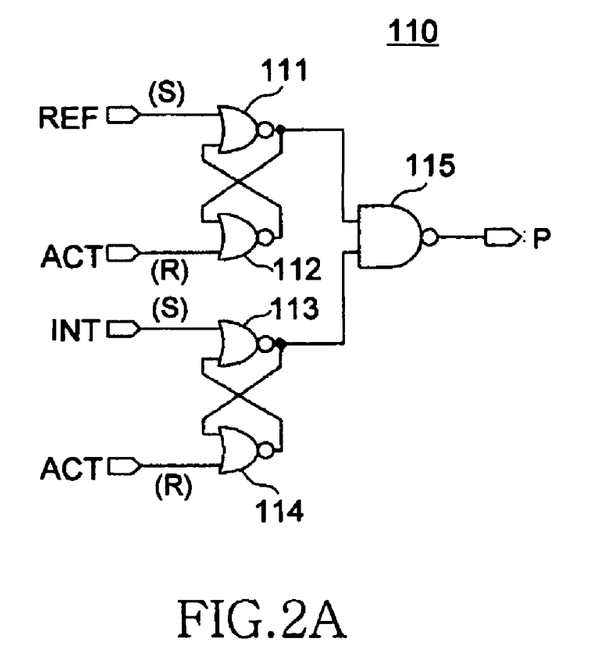
FIG. 2A is a circuit diagram of a pulse generating circuit 110.
Figure 2B:
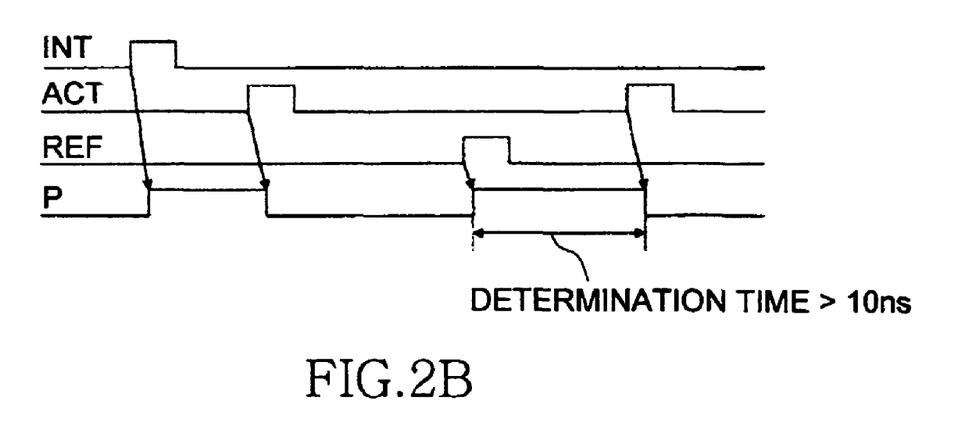
FIG. 2B is a timing chart for explaining an operation of the pulse generating circuit 110.

FIG. 2A is a circuit diagram of the pulse generating circuit 110, and FIG. 2B is a timing chart for explaining an operation of the pulse generating circuit 110.

As shown in FIG. 2A, the pulse generating circuit 110 is constituted by NOR circuits 111 to 114 and a NAND circuit 115. The NOR circuits 111 and 112 form an SR latch, in which the refresh signal REF is supplied to a set input side (S), and the active signal ACT is supplied to a reset input side (R). Similarly, the NOR circuits 113 and 114 form an SR latch, in which the initialization signal INT is supplied to a set input side (S), and the active signal ACT is supplied to a reset input side (R). Outputs of the SR latches are supplied to the NAND circuit 115, and an output of the NAND circuit 115 becomes a pulse signal P.

The operation of the pulse generating circuit 110 is as an operation in the timing chart shown in FIG. 2B. When the initialization signal INT or the refresh signal REF is activated, the level of the pulse signal P is changed to High. After that, when the active signal ACT is activated, the level of the pulse signal P returns to Low. As described above, the initialization signal INT is activated when the initialization information is set on the mode register 50, and the refresh signal REF is activated when a refresh command is issued. Therefore, after the initialization signal INT or the refresh signal REF is activated, an interval of 10 nanoseconds or more is set aside until the active signal ACT is activated. That is, the pulse width of the pulse signal P is equal to or longer than 10 nanoseconds. The pulse signal P generated in the above manner is supplied to the timing monitor 120.

Figure 3:
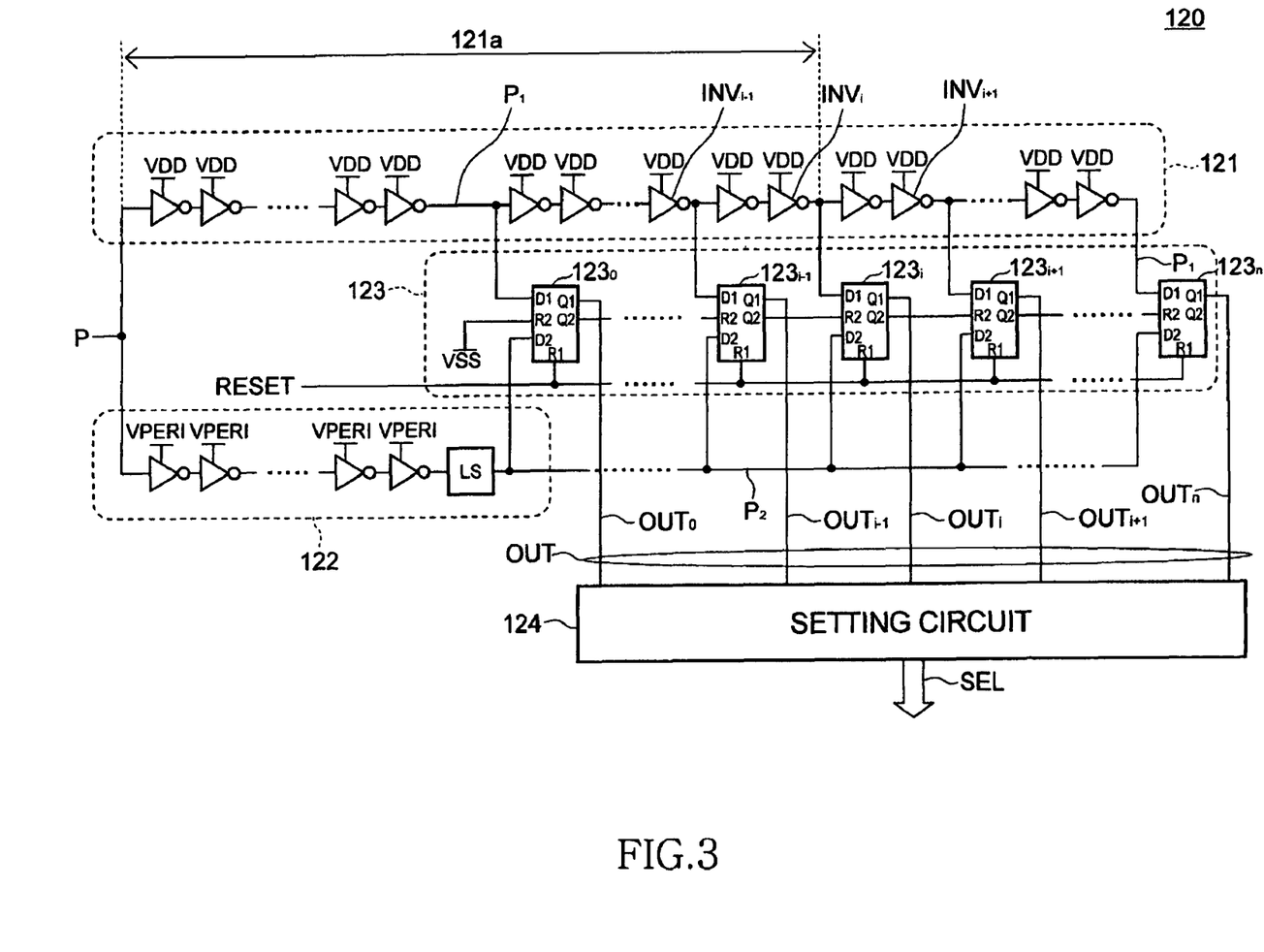
FIG. 3 is a circuit diagram of a timing monitor 120.

FIG. 3 is a circuit diagram of the timing monitor 120.

As shown in FIG. 3, the timing monitor 120 includes a first delay circuit 121 having a plurality of first delay elements connected in series and a second delay circuit 122 having a plurality of first delay elements connected in series, a detection circuit 123 that detects a difference in propagation speeds of the pulse signal P in the first and second delay circuits 121 and 122, and a setting circuit 124 that generates a selection signal SEL based on a detection signal OUT that is a detection result of the detection circuit 123. The first delay elements included in the first delay circuits 121 and the second delay elements included in the second delay circuits 122 operate different conditions, respectively.

The pulse signal P is simultaneously input to the first and second delay circuits 121 and 122. Each of the first and second delay circuits 121 and 122 has a circuit configuration in which a plurality of inverter circuits are connected in series. The power source voltage (external voltage) VDD is supplied to the inverter circuits of the first delay circuit 121 as its operating power supply, while the internal voltage $V_{PERI}$ is supplied to the inverter circuits of the second delay circuit 122 as its operating power supply. As described above, the relationship between the power source voltage VDD and the internal voltage $V_{PERI}$ is VDD>$V_{PERI}$.

Furthermore, when a fan-out of the inverter circuits constituting the first delay circuit 121 is represented as F1, and a fan-out of the inverter circuits constituting the second delay circuit 122 is represented as F2, they are set such that F1<F2. The first delay circuit 121 is a replica circuit of the delay control circuit 130; and therefore, an operation voltage and a fan-out of the delay elements included in the delay control circuit 130 are VDD and F1, respectively. The fan-out represents driving capability of an inverter circuit, meaning the number of inverter circuits at a subsequent stage that can be driven by an inverter circuit. For example, if the fan-out is three (F=3), it means that an inverter circuit (one output) can send a signal to three inverter circuits (three inputs) at the subsequent stage. In the case of a CMOS type logic, unlike a TTL type logic, an amount of an output current of an inverter circuit flowing into an input terminal of an inverter circuit at the subsequent stage is considerably small. However, by connecting a number of input terminals, electrostatic capacitances (parasitic capacitances) of each of the terminals and wiring areas are connected in parallel to an output terminal of the inverter circuit at a preceding stage. As a result, a capacitive load viewed from the output side is increased, which is called a fan-out. For this reason, if the driving capability of an output side element is not sufficient, a state transition of a signal from High to Low and from Low to High takes time. Because this puts a limitation on a circuit operation, the number of input terminals to be connected to the subsequent state is limited.

Therefore, a change of the delay amount of the second delay circuit 122 is larger than that of the first delay circuit 121 with respect to PVT variation. That is, if the delay amount of the first delay circuit 121 is increased from its design value due to the PVT variation, the delay amount of the second delay circuit 122 is even more increased. On the contrary, if the delay amount of the first delay circuit 121 is decreased from its design value due to the PVT variation, the delay amount of the second delay circuit 122 is even more decreased. The reason why there is such a difference between the delay circuits is that it is more susceptible to the PVT variation as the operation voltage is decreased and the fan-out is increased.

Figure 4:
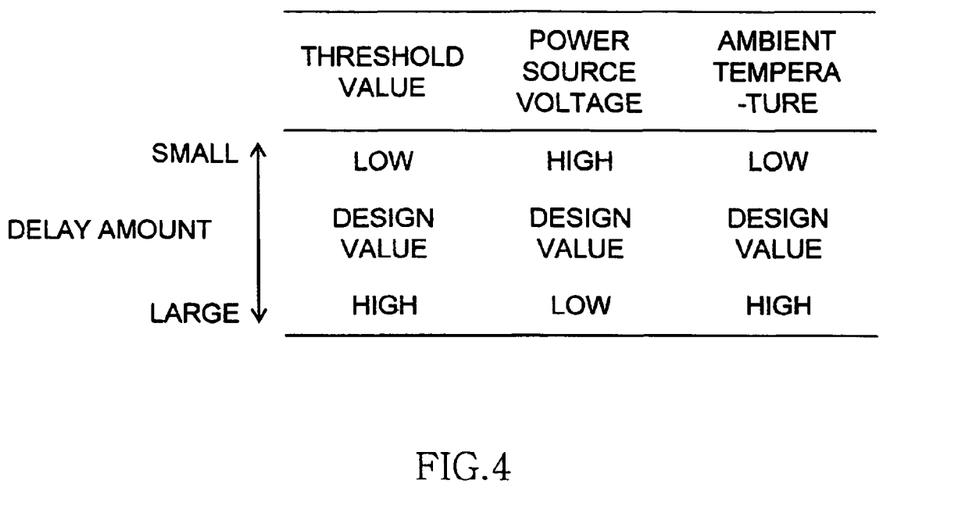
FIG. 4 is a diagram for explaining the change of the delay amount due to the PVT variation.

The change of the delay amount due to the PVT variation is shown in FIG. 4. As shown in FIG. 4, the delay amount decreases as the threshold value decreases due to the process fluctuation. On the contrary, the delay amount increases as the threshold value increases. Furthermore, the delay amount decreases as the power source voltage increases, and on the contrary, the delay amount increases as the power source voltage decreases. Moreover, the delay amount decreases as the ambient temperature decreases, and on the contrary, the delay amount increases as the ambient temperature increases. As described above, such change of the delay amount is more prominent on the second delay circuit 122 than on the first delay circuit 121.

When the pulse signal propagating through the first delay circuit 121 represented as $P_1$ and the pulse signal propagating through the second delay circuit 122 represented as $P_2$, if each of the inverter circuits operates with a delay amount as the design value, a phase of the pulse signal $P_1$ output from a predetermined inverter circuit $INV_i$ (delay element) included in the first delay circuit 121 is configured to match with a phase of the pulse signal $P_2$ output from the second delay circuit 122. That is, it is designed that the delay amount of a first stage 121a of the first delay circuit 121 is the same as the delay amount of the second delay circuit 122. However, if the delay amount is deviated from the design value due to the PVT variation, it is not the case anymore. As described above, because the change of the delay amount due to the PVT variation is more prominent on the second delay circuit 122 than on the first delay circuit 121, under a condition that the delay amount is increased due to the PVT variation, the pulse signal $P_1$ with the phase matched with the pulse signal $P_2$ is output from an inverter circuit ($INV_{i+1}$ and later) at the subsequent stage. On the other hand, under a condition that the delay amount is decreased due to the PVT variation, the pulse signal $P_1$ with the phase matched with the pulse signal $P_2$ is output from an inverter circuit ($INV_{i-1}$ and earlier) at the preceding stage. It is detected by the detection circuit 123 whether the phase of the pulse signal $P_1$ output from which inverter circuit matches with the phase of the pulse signal $P_2$.

As shown in FIG. 3, the detection circuit 123 is constituted by n+1 number of comparator circuits $123_0$ to $123_n$. The pulse signals $P_1$ output from different inverter circuits of the first delay circuit 121 are input to first input terminals D1 of the comparator circuits $123_0$ to $123_n$, respectively, and the pulse signal $P_2$ is commonly supplied to second input terminals D2 of the comparator circuits $123_0$ to $123_n$. In addition, a level shift circuit LS is provided at the final stage of the second delay circuit 122, with which the output amplitude of the second delay circuit 122 becomes VDD.

Furthermore, reset terminals R1 and R2 are provided on each of the comparator circuits $123_0$ to $123_n$. A reset signal RESET is commonly supplied to reset terminals R1 of the comparator circuits $123_0$ to $123_n$, and the reset terminal R2 of each of the comparator circuits $123_0$ to $123_n$ is connected to a second output terminal Q2 of a comparator circuit at the preceding stage. The reset terminal R2 of the comparator circuit $123_0$ at the first stage is fixed to VSS (Low level). In addition, a first output terminal Q1 is provided on each of the comparator circuits $123_0$ to $123_n$. An output from the first output terminal Q1 is supplied to the setting circuit 124. The reset signal RESET is a signal that is activated every time the timing monitor 120 is activated.

Figure 5:
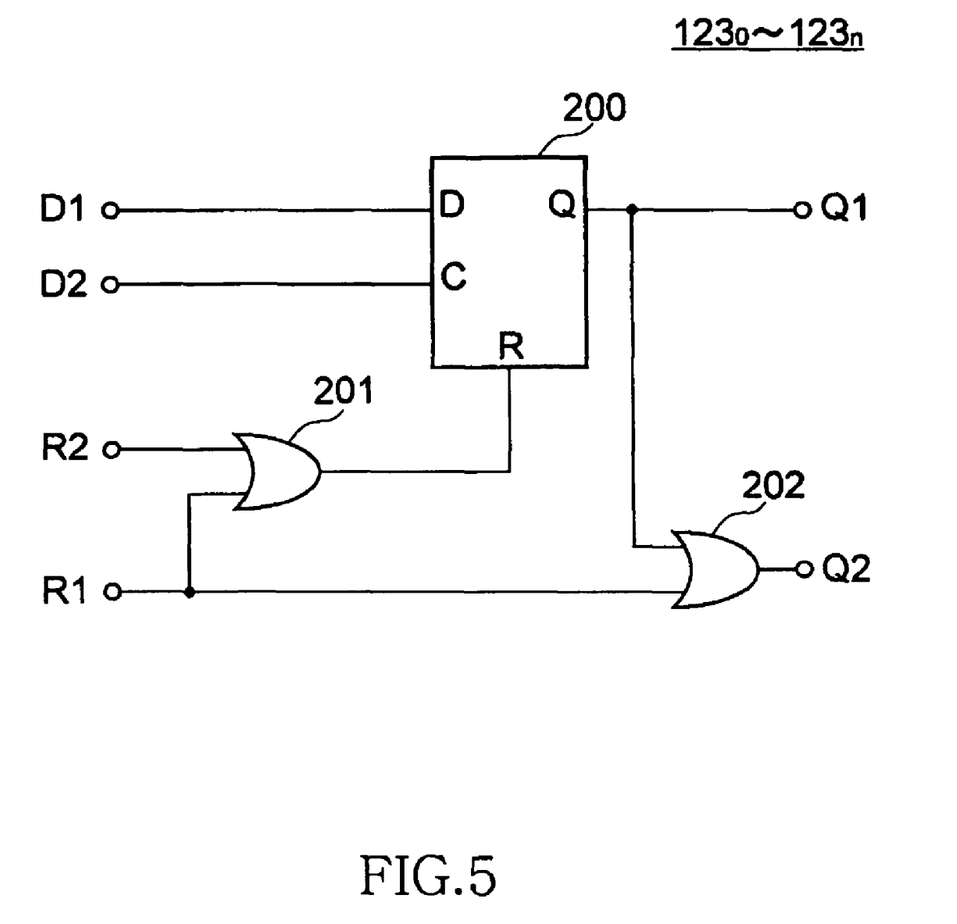
FIG. 5 is a diagram showing a specific circuit configuration of each of comparator circuits $123_0$ to $123_n$.

FIG. 5 shows a specific circuit configuration of each of the comparator circuits $123_0$ to $123_n$.

As shown in FIG. 5, each of the comparator circuits $123_0$ to $123_n$ includes a D latch circuit 200 with an input terminal D connected to the first input terminal D1, a clock terminal C connected to the second input terminal D2, and an output terminal Q connected to the first output terminal Q1. Furthermore, a signal obtained by a logical sum operation of the signals input to the reset terminals R1 and R2 by an OR circuit 201 is input to a reset terminal R of the D latch circuit 200. In addition, a logical sum operation is performed on the signal input to the reset terminal R1 and a signal output from the output terminal Q of the D latch circuit 200 by an OR circuit 202, and its output is output from the second output terminal Q2.

With the circuit configuration described above, in a circuit in which the phase of the pulse signal $P_1$ matches with the phase of the pulse signal $P_2$ from among the comparator circuits $123_0$ to $123_n$ (more accurately, a comparator circuit in which the level of the pulse signal $P_1$ is changed to High right after the level of the pulse signal $P_2$ is changed to High), the level of the first output terminal Q1 is changed to High. In the other comparator circuits, the levels of the first output terminals Q1 are Low. This is because a Low level is latched on the D latch circuit 200 in a comparator circuit located at an earlier stage of a comparator circuit that detected the phase matching, and the D latch circuit 200 is reset by the reset terminal R2 in a comparator circuit located at a subsequent stage of the comparator circuit that detected the phase matching.

The setting circuit 124 is a circuit that converts the detection signal OUT generated in such a manner into the selection signal SEL. The type of conversion depends on a circuit configuration of the delay control circuit 130 that receives the selection signal SEL and the like. For simplicity, an explanation will be given taking a case that the delay control circuit 130 has a circuit configuration shown in FIG. 6, and the detection signal OUT is configured with 3 bits (that is, the number of comparator circuits included in the detection circuit 123 is three).

Figure 6:
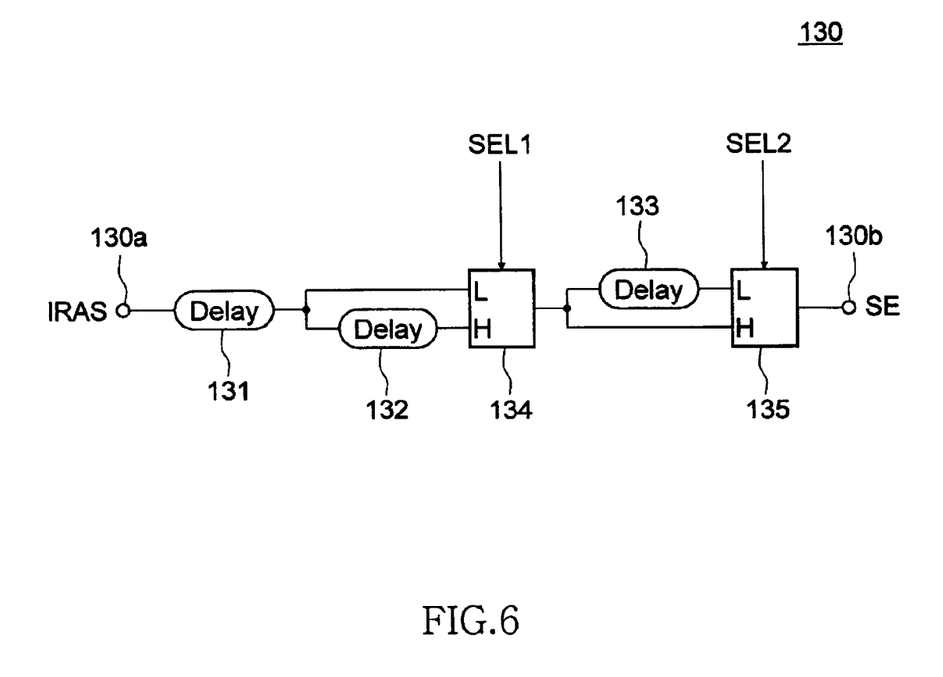
FIG. 6 is a circuit diagram of a delay control circuit 130.

The delay control circuit 130 shown in FIG. 6 is a circuit that generates the sense enable signal SE by delaying the strobe signal IRAS. The delay amount for delaying the strobe signal IRAS is variable. Specifically, three delay elements 131 to 133 are connected in series between an input terminal 130a and an output terminal 130b. The delay elements 132 and 133 at the second and third stages are configured to be able to bypass by switching selectors 134 and 135, respectively. The switching of the selector 134 is controlled by SEL1, which is a 1 bit of the selection signal SEL, and the switching of the selector 135 is controlled by SEL2, which is another 1 bit of the selection signal SEL. With this arrangement, the number of delay elements existing on a signal path between the input terminal 130a and the output terminal 130b can be switched from one to three.

The delay elements 131 to 133 included in the delay control circuit 130 have the same circuit configuration as the first delay circuit 121 included in the timing monitor 120. In other words, it can be said that the delay control circuit 130 includes a third delay circuit that has the same circuit configuration as that of the first delay circuit 121.

Figure 7:
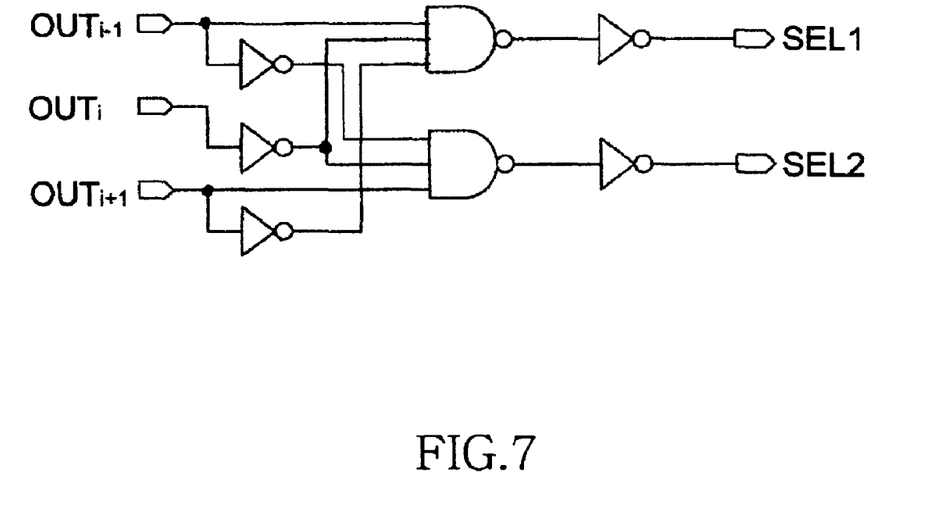
FIG. 7 is a circuit diagram of a setting circuit 124.

When the delay control circuit 130 has the above circuit configuration, the setting circuit 124 can take a circuit configuration shown in FIG. 7. In FIG. 7, a signal $OUT_{i+1}$ is an output of a comparator circuit located at the earliest stage, and a signal $OUT_{i+1}$ is an output of a comparator circuit located at the last stage. Therefore, if the delay amount is smaller than the design value due to the PVT variation, the signal $OUT_{i-1}$ is activated, and if the delay amount is larger than the design value due to the PVT variation, the signal $OUT_{i+1}$ is activated. When the delay amount is virtually the same as the design value, a signal $OUT_i$ is activated.

Figure 8:
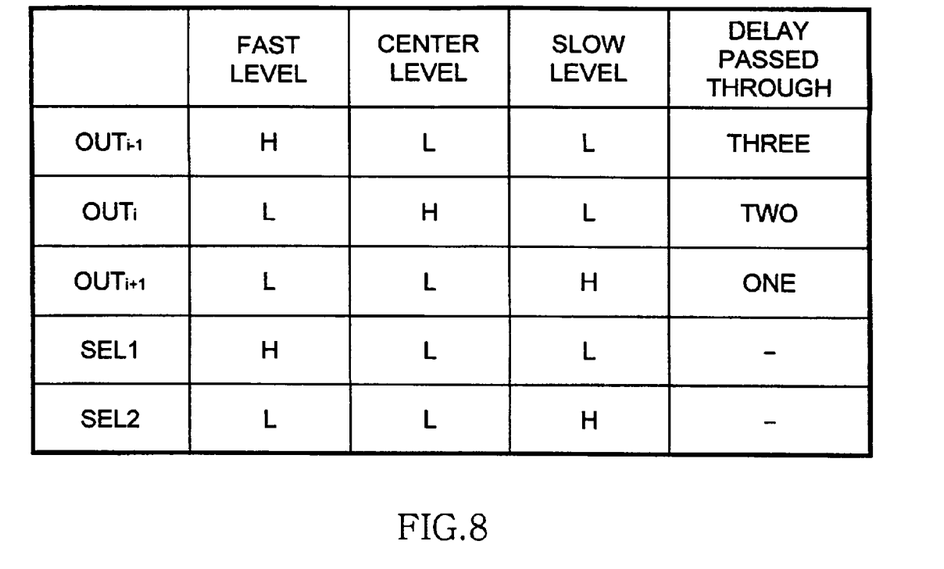
FIG. 8 is a truth table showing the setting circuit 124 shown in FIG. 7.
Figure 9A:
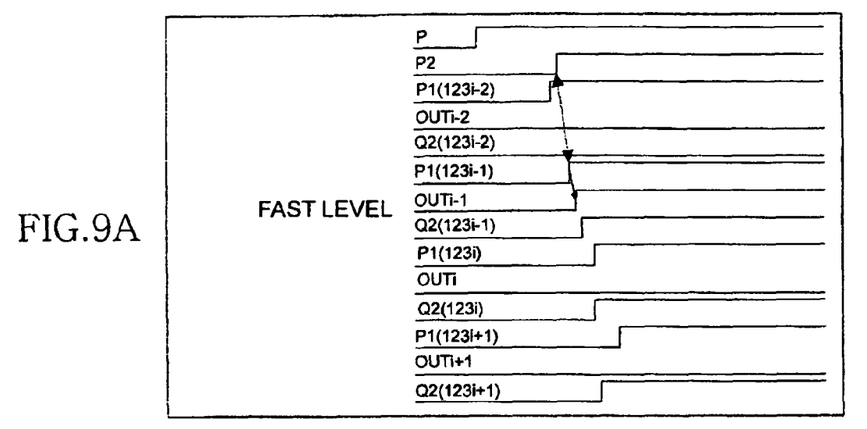
FIGS. 9A to 9C are timing charts showing an operation of a timing monitor 120.

FIG. 8 shows a truth table of the circuit shown in FIG. 7. As shown in FIG. 8, in the case that the level of the signal $OUT_{i-1}$ is High, that is, a case that the delay amount is smaller than the design value (Fast level), the level of the selection signal SEL1 becomes High and the level of the selection signal SEL2 becomes Low. The selector 134 and 135 shown in FIG. 6 then select a High level side input terminal and a Low level side input terminal, respectively. As a result, the strobe signal IRAS passes through all the three delay elements 131 to 133. That is, the delay amount of the delay control circuit 130 takes its maximum value. In this case, because the delay amount is smaller than the design value due to the PVT variation, the actual delay amount of the delay control circuit 130 is brought close to the design value. The case that the level of the signal $OUT_{i-1}$ is High corresponds to, as shown in FIG. 9A, a case that the level of the pulse signal $P_1$ input to the comparator circuit $123_{i-1}$ is changed to High right after the level of the pulse signal $P_2$ is changed to High.

Figure 9B:
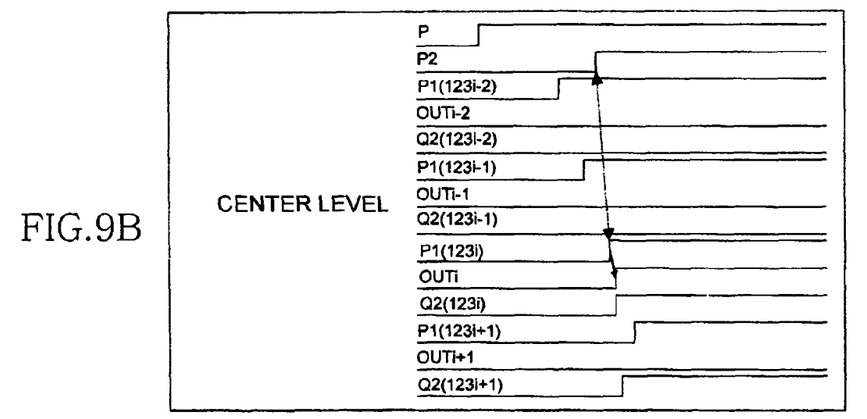

In the case that the level of the signal $OUT_i$ is High, that is, a case that the delay amount is virtually the same as the design value (Center level), the levels of both of the selection signals SEL1 and SEL2 become Low. Both of the selector 134 and 135 shown in FIG. 6 then select a Low level side input terminal, and as a result, the strobe signal IRAS passes through the two delay elements 131 and 133. That is, the delay amount of the delay control circuit 130 takes an intermediate value. In this case, because it indicates that the delay amount is approximately the same as the design value, the actual delay amount of the delay control circuit 130 is also approximately the same as the design value. The case that the level of the signal $OUT_i$ is High corresponds to, as shown in FIG. 9B, a case that the level of the pulse signal $P_1$ input to the comparator circuit $123_i$ is changed to High right after the level of the pulse signal $P_2$ is changed to High.

Figure 9C:
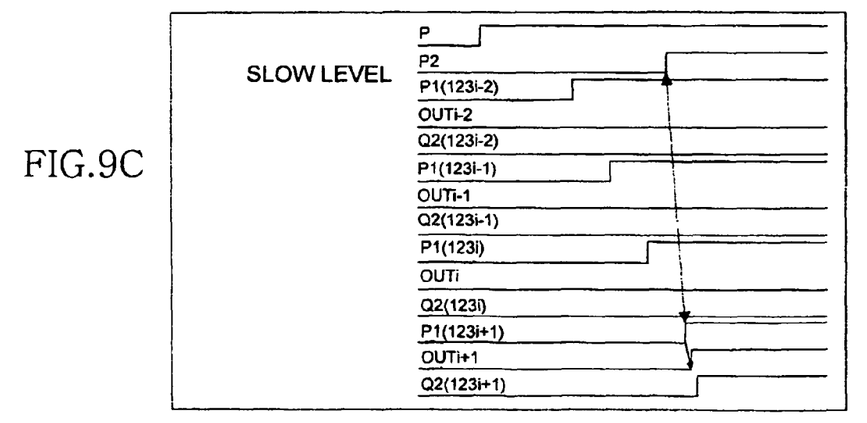

Furthermore, in the case that the level of the signal $OUT_{i+1}$ is High, that is, a case that the delay amount is larger than the design value (Slow level), the level of the selection signal SEL1 becomes Low and the level of the selection signal SEL2 becomes High. The selector 134 and 135 shown in FIG. 6 then select a Low level side input terminal and a High level side input terminal, respectively, and as a result, the strobe signal IRAS passes through only a single unit of the delay element 131. That is, the delay amount of the delay control circuit 130 takes its minimum value. In this case, because it indicates that the delay amount is larger than the design value due to the PVT variation, the actual delay amount of the delay control circuit 130 is brought close to the design value. The case that the level of the signal $OUT_{i+1}$ is High corresponds to, as shown in FIG. 9C, a case that the level of the pulse signal $P_1$ input to the comparator circuit $123_{i+1}$ is changed to High right after the level of the pulse signal $P_2$ is changed to High.

Setting of the delay amount for the delay control circuit 130 is performed as described above. In this manner, the activation timing of the sense enable signal SE generated by the delay control circuit 130 is kept virtually constant regardless of the PVT variation. As a result, the sense amplifiers SA can start their operations at an optimal timing on a constant basis.

As described above, the semiconductor device 10 according to the present embodiment monitors a variation of the delay amount due to the PVT variation by the timing monitor 120, and controls the delay amount of the delay control circuit 130 based on a monitoring result. Therefore, the semiconductor device 10 can properly correct a variation of the delay amount generated in the delay control circuit 130. Furthermore, in the present embodiment, because the first delay circuit 121 included in the timing monitor 120 is a replica circuit of the delay control circuit 130, the variation of the delay amount generated in the delay control circuit 130 can be monitored highly accurately. As a result, the correction of the delay amount can be performed highly accurately.

Moreover, in the present embodiment, the timing monitor 120 is not constantly operated, but intermittently operated; and therefore, the power consumption by the timing monitor 120 can be suppressed. Particularly, in the present embodiment, because the timing monitor 120 is activated in response to the initialization signal INT that is activated at the time of starting an operation of the semiconductor device 10, the monitoring of the PVT variation can be executed at the time of starting the operation without fail. In addition, in the present embodiment, because the timing monitor 120 is activated in response to an issuance of the refresh command, the monitoring of the PVT variation can be performed on a regular basis.

It is apparent that the present invention is not limited to the above embodiments, but may be modified and changed without departing from the scope and spirit of the invention.

For example, the delay control circuit 130 that takes the control of the delay amount is a circuit that determines an activation timing of the sense amplifiers SA based on an activation timing of the word driver 12 in the present embodiment; however, the usage of the delay control circuit that takes the control of the delay amount in the present invention is not limited thereto. Accordingly, the delay control circuit that takes the control of the delay amount can be a circuit that controls an activation timing of the column switch 14 by generating a column selection signal YSEL (see FIG. 1) based on an activation of the word driver 12.

Furthermore, in the present embodiment, the timing monitor 120 is activated in response to the initialization signal INT and the refresh signal REF; however, the timing for activating the timing monitor 120 is not limited thereto.

Moreover, in the present embodiment, the operation voltage and the fan-out of the inverter circuits are designed such that the change of the delay amount due to the PVT variation is more prominent on the second delay circuit 122 than on the first delay circuit 121. However, the present invention is not limited to the arrangement as long as the operation conditions of the delay circuits differ from each other. Therefore, either one of the operation voltage and the fan-out can be made different, or other methods can be alternatively used to make the operation condition different. In addition, the design can be taken such that the change of the delay amount due to the PVT variation is more prominent on the first delay circuit 121 than on the second delay circuit 122.

Furthermore, in the above embodiment, the target memory to which the present invention is applied is a DRAM; however, the application target of the present invention is not limited thereto. Alternatively, the present invention can be applied to other types of semiconductor memory devices (such as an SRAM, a PRAM, and a flash memory) and logic-based semiconductor devices.

The logic-based semiconductor device includes a semiconductor product such as a CPU (Central Processing Unit), an MCU (Micro Control Unit), a DSP (Digital Signal Processor), an ASIC (Application Specific Integrated Circuit), and an ASSP (Application Specific Standard Circuit). The device to which the present invention is applied is applicable to a semiconductor device, such as an SOC (System On Chip), an MCP (Multichip Package), and a POP (Package On Package). In addition, the circuit format of the pulse generating circuit 110, the delay control circuit 130, the detection circuit 123, the setting circuit 124, and the like can be arbitrarily designed based on the characteristics of each of the circuit.

What is claimed is:

1. A semiconductor device, comprising:
   a delay control circuit that generates an operation timing signal by delaying a reference signal by a predetermined delay amount;
   a first delay circuit having a plurality of first delay elements connected in series;
   a second delay circuit having a plurality of second delay elements connected in series, the first and second delay elements operating different conditions, respectively;
   a detection circuit that detects a difference in propagation speed of a pulse signal simultaneously input to the first and second delay circuits; and
   a setting circuit that sets the delay amount of the delay control circuit based on a detection result from the detection circuit,
   wherein the first delay elements and the second delay elements differ from each other in a fan-out.

2. The semiconductor device as claimed in claim 1, wherein the first delay elements and the second delay elements differ from each other in a change of a delay amount due to PVT (process, voltage, and temperature) variation.

3. The semiconductor device as claimed in claim 2, wherein the first delay elements and the second delay elements differ from each other in an operation voltage.

4. The semiconductor device as claimed in claim 1, wherein an operation voltage of the first delay elements is higher than an operation voltage of the second delay elements, and a fan-out of the first delay elements is smaller than a fan-out of the second delay elements.

5. The semiconductor device as claimed in claim 4, wherein the delay control circuit includes a third delay circuit having a plurality of third delay elements connected in series, and the first delay elements and the third delay elements are the same in an operation voltage and a fan-out.

6. The semiconductor device as claimed in claim 5, wherein the setting circuit sets to increase the delay amount of the delay control circuit as the propagation speed of the pulse signal propagating through the second delay circuit is faster than the propagation speed of the pulse signal propagating through the first delay circuit, and the setting circuit sets to decrease the delay amount of the delay control circuit as the propagation speed of the pulse signal propagating through the second delay circuit is slower than the propagation speed of the pulse signal propagating through the first delay circuit.

7. The semiconductor device as claimed in claim 1, wherein the pulse signal is generated intermittently.

8. A semiconductor device, comprising:

a delay control circuit that generates an operation timing signal by delaying a reference signal by a predetermined delay amount;

a first delay circuit having a plurality of first delay elements connected in series;

a second delay circuit having a plurality of second delay elements connected in series, the first and second delay elements operating different conditions, respectively;

a detection circuit that detects a difference in propagation speed of a pulse signal simultaneously input to the first and second delay circuits;

a setting circuit that sets the delay amount of the delay control circuit based on a detection result from the detection circuit;

a memory cell array that includes a plurality of word lines, a plurality of bit lines, and a plurality of memory cells each arranged at an associated one of intersections of the word lines and the bit lines;

a word driver that selects any one of the word lines; and a plurality of sense amplifiers each connected to corresponding one of the bit lines, wherein the reference signal is a signal synchronized with an activation timing of the word driver, and the operation timing signal is a signal for activating the sense amplifiers.

9. The semiconductor device as claimed in claim 8, wherein the memory cell is a DRAM (Dynamic Random Access Memory) cell, and the pulse signal is generated in response to at least an issuance of a refresh command.

10. A semiconductor device, comprising:

a delay control circuit that generates an operation timing signal by delaying a reference signal by a predetermined delay amount;

a first delay circuit having a plurality of first delay elements connected in series;

a second delay circuit having a plurality of second delay elements connected in series, the first and second delay elements operating different conditions, respectively;

a detection circuit that detects a difference in propagation speed of a pulse signal simultaneously input to the first and second delay circuits;

a setting circuit that sets the delay amount of the delay control circuit based on a detection result from the detection circuit;

a memory cell array that includes a plurality of word lines, a plurality of bit lines, and a plurality of memory cells each arranged at an associated one of intersections of the word lines and the bit lines;

a word driver that selects any one of the word lines;

a plurality of sense amplifiers each connected to corresponding one of the bit lines; and a column switch that selects any one of the sense amplifiers, wherein the reference signal is a signal synchronized with an activation timing of the word driver, and the operation timing signal is a signal for activating the column switch.

11. The semiconductor device as claimed in claim 10, wherein the memory cell is a DRAM (Dynamic Random Access Memory) cell, and the pulse signal is generated in response to at least an issuance of a refresh command.

* * * * *